United States Patent [19]
Asaida

[11] Patent Number: 4,761,682
[45] Date of Patent: Aug. 2, 1988

[54] OPTICAL LOW-PASS FILTER INCLUDING THREE CRYSTAL PLATES FOR A SOLID-STATE COLOR TV CAMERA

[75] Inventor: Takashi Asaida, Kanagawa, Japan

[73] Assignee: Sony Corporation, Tokyo, Japan

[21] Appl. No.: 867,224

[22] Filed: May 27, 1986

[30] Foreign Application Priority Data

May 27, 1985 [JP] Japan .................................. 60-113464
May 27, 1985 [JP] Japan .................................. 60-113465

[51] Int. Cl.⁴ ...................... H04N 9/097; H04N 9/04; G02B 27/28
[52] U.S. Cl. ..................................... 358/50; 358/41; 358/55; 350/404
[58] Field of Search ...................... 358/41, 43, 44, 47, 358/50, 55; 350/400, 401, 404, 405

[56] References Cited

U.S. PATENT DOCUMENTS

| | | | |
|---|---|---|---|
| 3,588,224 | 6/1971 | Pritchard | 358/55 |
| 3,784,734 | 1/1974 | Watanabe et al. | 358/44 |
| 4,249,203 | 2/1981 | Yamanaka | 358/50 |
| 4,539,584 | 9/1985 | Otake | 358/55 |
| 4,575,193 | 3/1986 | Greivencamp, Jr. | 358/55 |
| 4,626,897 | 12/1986 | Sato et al. | 358/55 |

FOREIGN PATENT DOCUMENTS

| | | | |
|---|---|---|---|
| 0094676 | 11/1983 | European Pat. Off. | |
| 0176334 | 4/1986 | European Pat. Off. | 358/44 |
| 52-66449 | 6/1977 | Japan | 358/44 |
| 57-39683 | 3/1982 | Japan | 358/44 |
| 59-279 | 1/1984 | Japan | 358/44 |
| 60-164719 | 8/1985 | Japan | |
| 60-237769 | 11/1985 | Japan | 358/50 |

OTHER PUBLICATIONS

*Patent Abstracts of Japan*, vol. 6, No. 111 (E-114) (989), Jun. 22, 1982 (Yamanaka, Kokai 57-39683).
*Patent Abstracts of Japan*, vol. 9, No. 240 (E-345) (1963), Sep. 26, 1985 (miyagawa, Kokai 60-90484).
*Patent Abstracts of Japan*, vol. 10, No. 7 (P-419) (2064), Jan. 11, 1986 (Nakada et al., Kokai 60-164719).

*Primary Examiner*—James J. Groody
*Assistant Examiner*—Randall S. Svihla
*Attorney, Agent, or Firm*—Hill, Van Santen, Steadman & Simpson

[57] ABSTRACT

An optical filter for use in a solid state color camera containing a plurality of solid state image sensing devices having a predetermined horizontal scanning direction, the filter including a first crystal plate for separating an incident ray into an ordinary ray and extraordinary rays in a direction of 45° with respect to the horizontal scanning direction of said solid state image sensing devices, a second crystal plate for separating the incident ray thereof into an ordinary ray and extraordinary rays in a direction which coincides with the horizontal scanning direction, and a third crystal plate for separating the incident ray into an ordinary ray and extraordinary ray in a direction of −45° with respect to the horizontal scanning direction. The second crystal plate is located between the first and third crystal plates, and the three plates are bonded together in the form of a laminate. The optical filter thus produced provides a point diffusion for an incident ray to direct the diffused rays on the solid state image sensing devices. The optical filter then forms first and second trap straight lines and a third trap straight line extending along the vertical scanning direction of the solid state image sensing devices for distributing a spatial frequency spectrum of a sampled output from the solid state sensing device.

2 Claims, 6 Drawing Sheets

OPTICAL LOW-PASS FILTER INCLUDING THREE CRYSTAL PLATES FOR A SOLID-STATE COLOR TV CAMERA

BACKGROUND OF THE INVENTION

The present invention is in the field of solid state color cameras using solid state image sensing devices such as charge coupled devices (CCD) and metal oxide semiconductors (MOS).

Solid state cameras have constructions which include solid state image sensing devices, such as CCD's or MOS devices, which are arranged in the form of a lattice on a two-dimensional plane so that images resulting from a camera lens system are discretely sampled. Such solid state color cameras have been suggested as suitable image sensing means for a small sized color television camera apparatus.

However, since this type of solid state camera carries out two-dimensional sampling by means of three primary color picture elements (pixels) arranged to provide images in two dimensions, sampled outputs have spatial frequency spectra having carrier frequency components at predetermined frequency positions with respect to a carrier frequency on a base band on the basis of a horizontal directional frequency and a vertical directional frequency which are determined on the basis of the pitch between individual image sensing devices which constitute each picture element.

If carrier components other than that of the base bands are left intact, they provide a source of difficulty such as a moire or a cross-color phenomenon on reproduced images of color televisions when the images are reproduced on the basis of sampled outputs. Among methods suggested for solving this problem include the use of an optical low-pass filter in which the light received from the camera lens system is optically diffused on the basis of a point diffusion characteristic of an optical filter to form a trap within a spatial spectrum of frequency by the utilization of birefringence of a crystal plate.

The above-described low-pass filter is inserted between a solid state image sensing device and a solid state camera lens system. The solid state camera is arranged, as shown in FIG. 1, such that the solid state image sensing devices such as CCD image sensors are arranged in sequence at the interval having a pitch $P_x$, for example, of 17 microns in the horizontal direction (the H direction) and CCD image sensors are positioned at another interval of pitch $P_y$, for example, 13 microns, in the vertical direction (the V direction).

Figure 1:
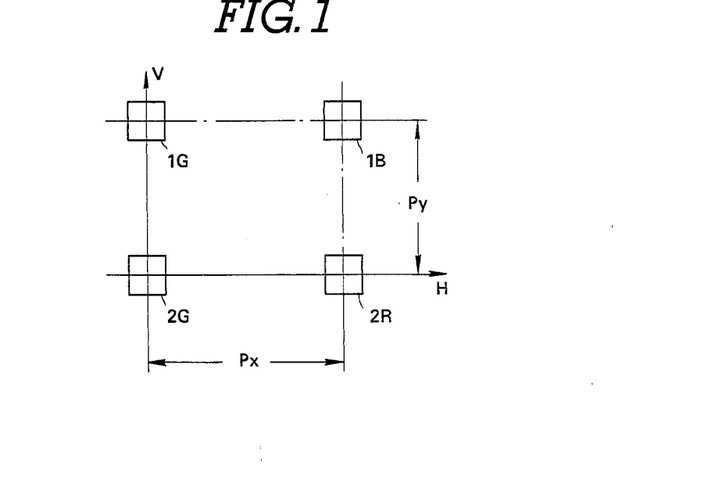
FIG. 1 is a diagrammatic view illustrating the construction of a solid state image sensing device according to the present invention.
Figure 2:
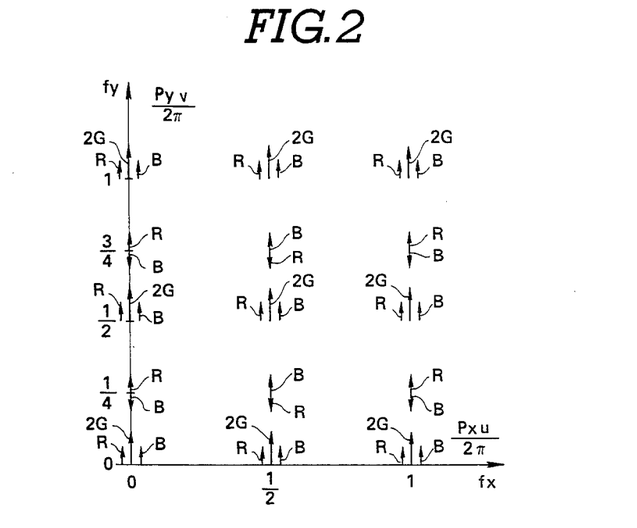
FIG. 2 is a characteristic graph showing the spatial frequency characteristic of a sampled output of the device shown in FIG. 1.

Referring to FIG. 1, in a picture element group constituted by CCD image sensors, there are blue color elements 1B disposed adjacent green color elements 1G in the H direction and green color elements 2G disposed adjacent the green color elements 1G in the V direction. Further, red color elements 2R are positioned adjoining the green color elements 2G in the H direction and adjoining the blue color elements 1B in the V direction. Consequently, each set of four elements 1G, 1B, 2G and 2R is sequentially arrayed in both the H and V directions and thus a two-dimensional solid state image sensing device pattern is formed. When images received from the camera lens system of the solid state camera mentioned above are sampled, the sampled outputs have a spatial frequency spectrum as shown in FIG. 2. The lateral axis and longitudinal axis of FIG. 2 are expressed as numerical values normalized using such values as $P_y v/2\pi$ and $P_x u/2\pi$ on the basis of the pitch of the picture elements $P_x$ and $P_y$ in the H direction and V direction, respectively. In addition, the arrow marks R, G, B at each frequency position denote phases of carrier components of the red, green, and blue color signals.

As will be seen from FIG. 2, the sampled outputs derived from the solid state camera constructed as in FIG. 1 have carrier components at frequency positions $f_x=0, \frac{1}{2}, 1, \ldots$ in the H direction and at the frequency positions $f_y=0, \frac{1}{4}, \frac{1}{2}, \frac{3}{4}, \ldots$ in the V direction.

The base band component is produced at the frequency position ($f_x=0$, $f_y=0$), and the carrier components generated at the other frequency positions are unnecessary signal components which may provide sources of deteriorating picture qualities of images when the sampled outputs are reproduced.

For example, the carrier components produced at the frequency point ($f_x=1$, $f_y=0$) as a center will produce a moiré on a reproduced picture of an image signal if the object to the picture has a fine stripe pattern comprising black and white stripes extending in the vertical direction.

On the other hand, the carrier components produced with the frequency position ($f_x=\frac{1}{2}$, $f_y=0$) as a center will produce the cross-color phenomenon on the green and magenta colors if an object to be pictured has a slightly coarse longitudinal directional stripe.

Furthermore, the carrier components produced at the frequency position ($f_x=0$, $f_y=\frac{1}{2}$) as a center will produce a flicker on the vertical edge of the reproduced image. Hence, if filtering means are provided for eliminating the components produced at frequency positions other than the frequency position ($f_x=0$, $f_y=0$) without attenuation of the base band component corresponding to the frequency position ($f_x=0$, $f_y=0$), the picture of the object can be reproduced with high resolution on the basis of the image signal produced from the solid state color camera.

SUMMARY OF THE INVENTION

With the foregoing in mind, the present invention seeks to provide an optical filter for a solid state color camera which can effectively eliminate unnecessary and undesirable carrier components without attenuation of the base band component.

In accordance with the present invention, there is provided a solid state color camera having an optical filter which comprises: (a) a first crystal plate for separating an incident ray of light into an ordinary ray and an extraordinary ray in a direction of +45° with respect to the horizontal scanning direction (H direction) of a solid state image sensing device, (b) a second crystal plate for separating an incident ray of light into an ordinary ray and an extraordinary ray in parallel to the horizontal scanning direction, and (c) a third crystal plate for separating an incident ray of light into an ordinary ray and an extraordinary ray in a direction of −45° with respect to the horizontal scanning direction. The first, second and third crystal plates are secured together in the form of a laminate with the second crystal plate being located between the first and third plates, the solid state image sensing device comprising green, blue and red color chips arranged in sequence. The optical filter forms first and second trap straight lines having positive and negative gradients and a third trap straight line extending along the vertical scanning direction (V direction) of the solid state image sensing device for a distribution of a spatial frequency spectrum of a sampled output taken from the output of the solid state image sensing device.

BRIEF DESCRIPTION OF THE DRAWINGS

A more complete understanding of the present invention may be obtained from the following detailed description taken in conjunction with the attached sheets of drawings in which.

DESCRIPTION OF THE PREFERRED EMBODIMENTS

Figure 3:
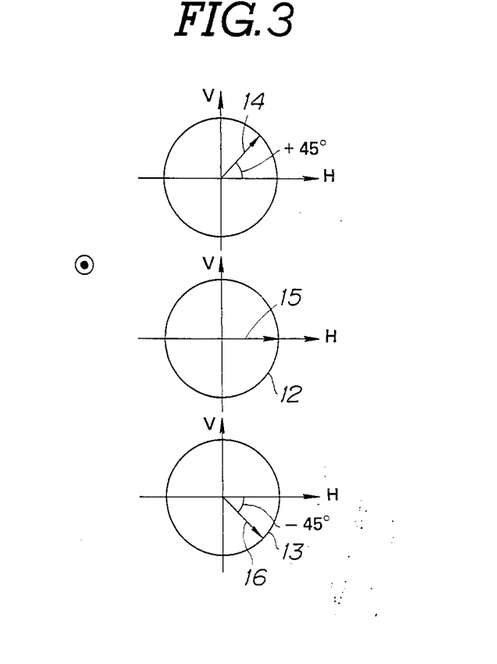
FIG. 3 is a diagrammatic view indicating the principal construction of an optical filter.
Figure 4:
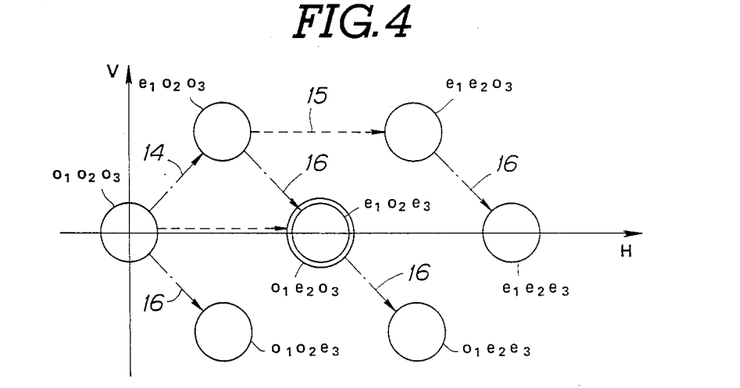
FIG. 4 is a diagrammatic view illustrating the positional relationship of a light ray diffused by an optical filter of the type employed in the present invention.

The present invention provides an optical means including an optical low-pass filter of the type shown diagrammatically in FIG. 3. As shown in that Figure, there are provided three sheets of crystal plates 11, 12 and 13, each having an angle of a refraction axis including an optic axis with respect to the horizontal scanning direction (H direction) changing mutually by 45°. These plates 11, 12, and 13 are laminated to one another in that order and fastened together. A light is obtained through a camera lens system from the lower position denoted by the encircled black dot at the left side of FIG. 3 perpendicular to the paper surface of FIG. 3 from the first crystal plate, this incident light falling on a solid state camera chip sequentially via the first crystal plate 11, the second crystal plate 12, and the third crystal plate 13.

It should be noted that the first crystal plate 11 is positioned so that its refraction axis 14 which is in the same direction as the optical axis of the crystal plate 11 provides an angle of +45° with respect to the H direction. The second crystal plate is positioned so that its refraction axis 15 coincides with the H direction. The third crystal plate is positioned so that its refraction axis 16 provides an angle of −45° with respect to the H direction. With the construction described above, the first crystal plate produces an ordinary ray $O_1$ and an extraordinary ray $e_1$ having light quantities of $\frac{1}{2}$ the incident ray thereof and the extraordinary ray $e_1$ is separated by a distance corresponding to the thickness of the crystal plate 11 in the direction of +45° with respect to the ordinary ray $O_1$. In this way, two separated rays are produced.

The above-described ordinary ray $O_1$ and extraordinary ray $e_1$ are passed to the second crystal plate 12 so that ordinary rays $O_2$ and extraordinary rays $e_2$ having respective light quantities of $\frac{1}{2}$ of the incident ray are produced. The extraordinary rays $e_2$ are separated by a distance corresponding to the thickness of the crystal plate 12 on the H direction with respect to the ordinary ray $O_2$. Consequently, four separated rays are produced at the second crystal plate.

When ordinary rays $O_2$ and extraordinary rays $e_2$ are passed on to the third crystal plate 13, ordinary rays $O_3$ and extraordinary rays $e_3$ having quantities of light $\frac{1}{2}$ of each incident ray are produced so that the extraordinary rays $e_3$ are separated by a distance corresponding to the thickness of the crystal plate 13 in a direction of −45° with respect to the ordinary rays $O_3$. Consequently, eight separate rays are produced and are sent on to the solid state camera chip.

For example, if the horizontal distance separating the extraordinary rays $e_1$ and $e_3$ in the first and third crystal plates is adjusted to, for example, $2P_x/2$ and the separate distance of the extraordinary ray $e_2$ in the second crystal plate 12 is adjusted to, for example, $P_x$, eight separated rays of different light paths of the three crystal plates 11, 12, and 13 are emitted with the rays $O_1e_2O_3$ and $e_1O_2e_3$ being overlapped at a position each separated by $P_x$ in the H direction with respect to the ray $O_1O_2O_3$ produced at an incident position of the incident light from an object to be pictured. In addition, rays $e_1O_2O_3$ and $O_1O_2e_3$ are emitted from the reference ray position $O_1O_2O_3$ in the directions of +45° and −45° with respect to the H direction and at substantially a center position between rays $O_1O_2O_3$, $O_1e_2O_3$, and $e_1O_2e_3$.

Furthermore, rays $e_1e_2O_3$ and $O_1e_2e_3$ are emitted from positions separated by $P_x$ in the H direction with respect to rays $e_1O_2O_3$ and $O_1O_2e_3$ (i.e., at a substantially center position between rays $O_1e_2e_3$, $e_1O_2e_3$, and $e_1e_2e_3$).

In this way, trap lines having a positive gradient and negative gradient in the H direction and another trap line in the V direction can be formed. As a result, the carrier components generated at other frequency positions can be minimized without attenuating the base band component at the center frequency position ($f_x=0$, $f_y=0$).

Figure 5A:
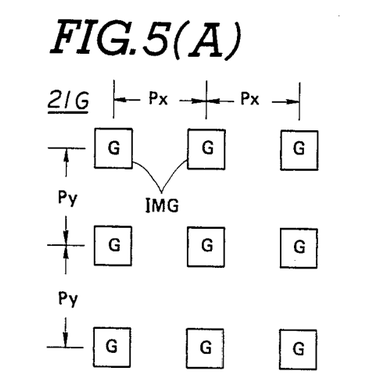
FIGS. 5(A) to 5(C) and 6 are diagrammatic views illustrating of a construction of a solid state image sensing device according to the present invention.
Figure 5B:
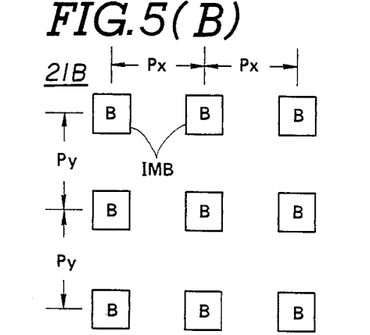
Figure 5C:
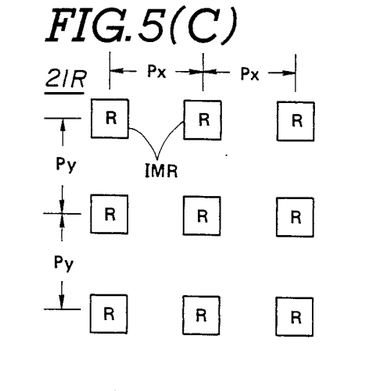
Figure 6:
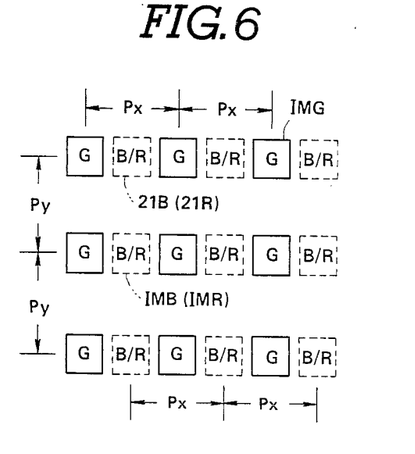

The solid state camera chips in the camera are arranged so that each primary color chip is arranged in a checkered pattern. The green color chip 21G has a construction in which the CCD image sensors IMG are sequentially arranged in a lattice form at positions separated by pitches $P_x$ and $P_y$ in the H and V directions as shown in FIG. 5(A). In addition, the blue color chip 21B and the red color chip 21R are arranged in the same way, the image sensors IMB and IMR being arranged sequentially in a lattice form as shown in FIGS. 5(B) and 5(C). The chips 21G, 21B, and 21R are arranged such that the image sensors IMB and IMR of the blue color chips 21B and the red color chips 21R are intervened between the image sensors IMG of the green color chips 21G, as shown in FIG. 6.

FIRST PREFERRED EMBODIMENT

The optical filter of the first embodiment, as shown in FIG. 3, includes a first crystal plate 11 having a refraction axis 14 at an angular position of +45° with respect to the H direction. The second crystal plate 12 has a refraction axis 15 in the H direction. The third crystal plate 13 has a refraction axis 16 of −45° with respect to the H direction. The movement distance $P_2$ of extraordinary rays $e_1$ and $e_3$ of the first and third crystal plates 11 and 13 is such as to satisfy the equation $P_2 = \sqrt{(2/4)}P_x$ (1). In addition, the separation distance $P_1$ of the extraordinary ray $e_2$ of the second crystal plate 12 is such as to satisfy the following relationship with respect to the pitch $P_x$ of the image sensing device in the H direction:

$$P_1 = \tfrac{1}{2}P_x \qquad (2)$$

Assuming that the position at which the emitted ray $O_1 O_2 O_3$ is obtained by ordinary rays $O_1$, $O_2$, and $O_3$ passing through the three sheets of crystal plates 11, 12 and 13 is a reference point, the pitch between each ray is such that an interval of distance $D_H$ in the H direction exists which satisfies the following equation:

$$D_H = P_1/2 = P_x/4 \qquad (3)$$

Figure 7:
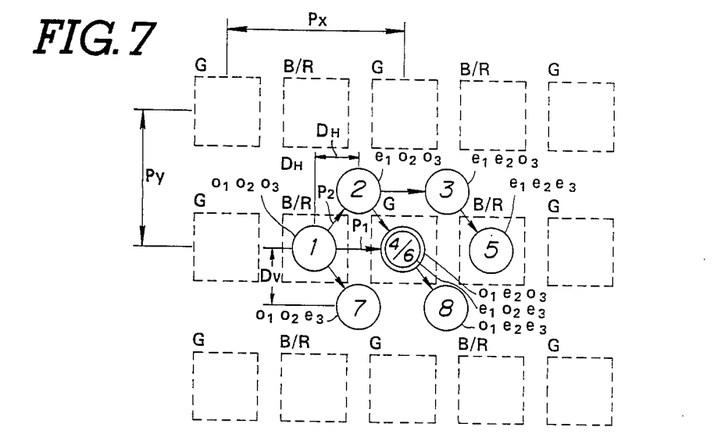
FIG. 7 is a diagrammatic view illustrating the positional relationship of a light ray diffused on a light ray diffusion characteristic of an optical filter in a first preferred embodiment according to the present invention.

The interval of distance $D_V$ in the V direction is shown in FIG. 7 and is expressed as follows:

$$D_V = P_1/2 = P_x/4 \qquad (4)$$

At the reference position, the first ray $O_1$, $O_2$, and $O_3$ comprising ordinary rays $O_1$, $O_2$, and $O_3$ of the first, second and third crystal plates 11, 12 and 13 is produced, as shown in FIG. 7. The extraordinary ray $e_1$ of the crystal plate 11 is separated by a distance $P_2$ in the direction which is +45° with respect to the reference position so that the ordinary rays $O_1$ and $O_3$ obtained from the crystal plates 12 and 13 produce a second ray $e_1 O_2 O_3$ at a position separated by the distances $D_H$ and $D_V$ in the H and V directions with respect to the reference positions.

If the extraordinary rays $e_1$ and $e_2$ of the first and second crystal plates 11 and 12 are emitted as an ordinary ray $O_3$ at the third crystal plate 13, the third ray $e_1 e_2 O_3$ is produced at a position displaced by $2D_H (P_1)$ in the H direction from the position of the second ray $e_1 O_2 O_3$.

If the extraordinary ray $e_1$ of the first crystal plate 11 and the ordinary ray $O_2$ of the second crystal plate 12 are emitted as an extraordinary ray $e_3$ of the crystal plate 13, a fourth ray $e_1 O_2 e_3$ is produced at a position separated by the distance $P_2$ in a direction of −45° with respect to the second ray $e_1 O_2 O_3$. The fourth ray $e_1 O_2 e_3$ is produced at a position displaced by $2D_H (P_1)$ in the H direction with respect to the reference position.

When an extraordinary ray $e_1$ of the crystal plate 11 and extraordinary ray $e_2$ of the crystal plate 12 are emitted as an extraordinary ray $e_3$ of the crystal plate 13, a fifth ray $e_1 e_2 e_3$ is produced at a position separated by a distance $P_2$ in a direction of −45° with respect to the position of the third ray $e_1 e_2 O_3$. The fifth ray $e_1 e_2 e_3$ is produced at a position displaced by $2D_H$ in the H direction with respect to the position of the fourth ray $e_1 O_2 e_3$.

When the ordinary ray $O_1$ of the first crystal plate 11 and an extraordinary ray $e_2$ of the second crystal plate 12 are emitted as an ordinary ray $O_3$ of the third crystal plate 13, a sixth ray $O_1 e_2 O_3$ is produced in the direction of −45° from the position of the second ray $e_1 O_2 O_3$ at a position displaced $2D_H$ with respect to the reference position on the line in the H direction passing through the reference position. The sixth ray $O_1 e_2 O_3$ is produced at a position coinciding with the fourth ray $e_1 O_2 e_3$.

When the ordinary ray $O_1$ of the first crystal plate 11 and an ordinary ray $O_2$ of the second crystal plate 12 are emitted as the extraordinary ray $e_3$ of the third crystal plate 13, a seventh ray $O_1 O_2 e_3$ is produced at a position separated by the distance $P_2$ in a direction of −45° with respect to the reference position. The seventh ray $O_1 O_2 e_3$ is produced at a position displaced by $D_H$ in the H direction and by $D_V$ in the V direction from the reference position.

When the ordinary ray $O_1$ of the first crystal plate 11 and the extraordinary ray $e_2$ of the second crystal plate 12 are emitted as the extraordinary ray $e_3$ of the third crystal plate 13, an eighth ray $O_1 e_2 e_3$ is produced at a position separated by the distance $P_2$ in the direction −45° from the position of the sixth ray $O_1 e_2 O_3$. Thus, the eighth ray $O_1 e_2 e_3$ is produced at a position displaced by $2D_H (P_1)$ in the H direction from the position of the seventh ray $O_1 O_2 e_3$.

Thus, when eight rays based on the incident ray on the reference position from the object to be pictured are emitted from the third crystal plate 13 having light quantities of $\tfrac{1}{8}$ of the incident ray and are diffused with the positional relationship shown in FIG. 7, the sampled outputs transmitted from the solid state camera chip exhibit trap characteristics for the carrier components other than the base band component included in the spatial frequency spectrum.

Figure 8:
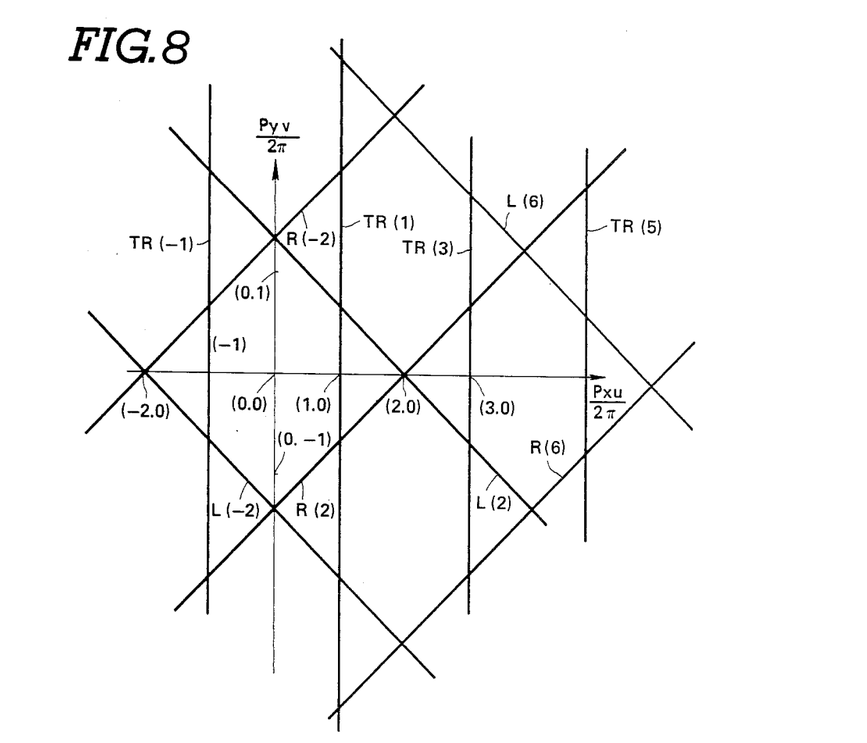
FIGS. 8 and 9 are characteristic graphs indicating trap characteristics of the spatial frequency in the first embodiment of the present invention.

For the distribution of the spatial frequency spectrum included in the sampled outputs, as shown in FIG. 8, the above-described optical low-pass filter generates trap straight lines ... L(−2), L(2), L(6), ..., having negative gradients, trap straight lines R(−2), R(2), R(6), ... , having positive gradients and a trap straight line TR(1) extending in parallel with the V direction. The trap straight lines ... L(−2), L(2), L(6) are parallel lines having the same negative gradients passing through the frequency positions (−2, 0), (2, 0) and (6, 0) ... and the other trap straight lines are parallel lines having the same positive gradients passing through the frequency positions (−2, 0), (2, 0), (6, 0) .... In this way, the trap straight lines L(−2), L(2), L(6) ..., and R(−2), R(2), R(6) ... are extended so as to mutually intersect. Consequently, a large number of diamond-shaped regions expanding symmetrically from the frequency position ($f_s = 0$, $f_v = 0$) as a center are formed on the spatial frequency spectrum.

A third trap straight line TR(1) extends in parallel with the V axis normalized by $(P_y V)/2\pi$ passing through the frequency position $f_s = 1$, $f_v = 0$) and extends in parallel with the V axis so that the trap straight line is formed to intersect the diamond-shaped region expanding along the V-axis direction at the frequency position ($f_s = 1$).

Figure 9:
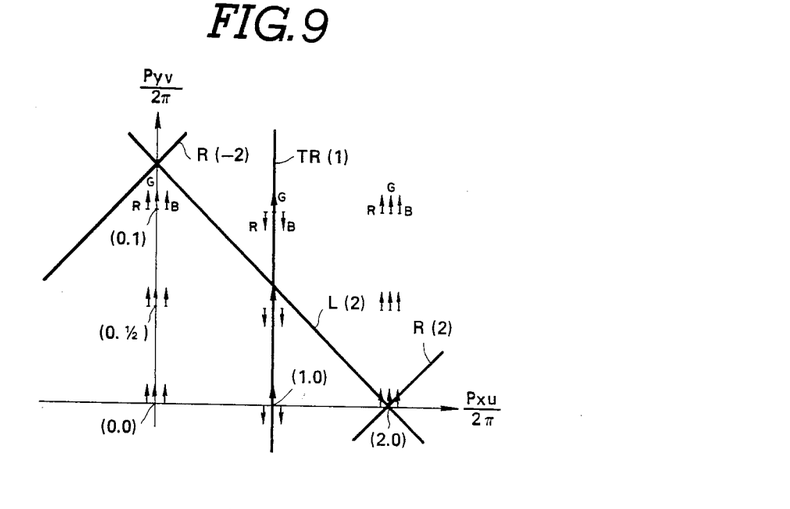

The trap effect for unnecessary carrier components included in the sampled outputs can effectively eliminate carrier components at the frequency position by means of the trap straight lines L(2) and R(2) at the frequency position ($f_s = 1$, $f_v = 0$). In addition, the trap straight lines L(2) and R(−2) intersect at a position adjacent to the frequency position ($f_s=0$, $f_v=1$) as shown in FIG. 9 so that a double trap effect is produced and thus a sufficient number of carrier components can be eliminated.

In this condition, when the trap straight line (TR(1)) is formed in parallel with the V axis, the unnecessary carrier components produced at the frequency positions ($f_s=0$, $f_v=0$), ($f_s=2$, $f_v=\frac{1}{2}$), $f_s=2$, $f_v=1$) can effectively be eliminated by means of the trap straight line TR(1).

SECOND PREFERRED EMBODIMENT

Figure 10:
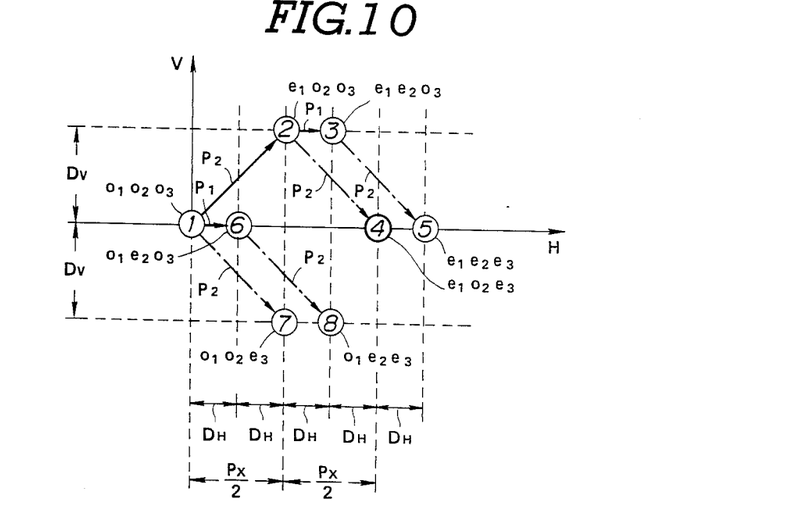
FIG. 10 is a diagrammatic view indicating the positional relationship of a light ray diffused in accordance with the diffusion characteristic of an optical fiber in a second preferred embodiment of the present invention.

As in the case of the previously described embodiment shown in FIG. 3, the optical filter in the second preferred embodiment includes a first crystal plate 11 having its refraction axis 14 at an angular position of $+45°$ with respect to the H direction. The second crystal plate 12 has a refraction axis 15 in the H direction, and the third crystal plate 13 has a refractive axis 16 at an angular position of $-45°$ in the H direction. The distance $P_2$ of extraordinary rays $e_1$ and $e_3$ of the first and third crystal plates 11 and 13 is, as seen from FIG. 10, determined as follows:

$$P_2 = \sqrt{(2/2)} P_x \quad (10)$$

In the case of this second preferred embodiment, there is a difference in that the separation distance $P_1$ of the extraordinary ray $e_2$ of the second crystal plate 12 is arranged as follows with respect to the image sensing device pitch $P_x$ in this H direction:

$$P_1 = \tfrac{1}{4} P_x \quad (20)$$

If the reference position is chosen as that position at which the emitted ray $O_1O_2O_3$ is produced by the rays $O_1$, $O_2$, and $O_3$, passing through the three sheets of crystal plates 11, 12, and 13, the pitch of each ray is:

$$D_H = P_1 \quad (30)$$

The interval $D_V$ in the vertical direction is given as:

$$D_V = 2P_1 \quad (40)$$

Thus, with reference to FIG. 10 the first ray $_1O_2O_3$ is produced at the reference position and comprises an ordinary ray $O_1$ of the crystal plate 11, an ordinary ray $O_2$ of the crystal plate 12, and an ordinary ray $O_3$ of the crystal plate 13.

The extraordinary ray $e_1$ of the first crystal plate 11 is separated by the distance $P_2$ in a direction of $+45°$ with respect to the reference position. Consequently, ordinary rays $O_2$ and $O_3$ obtained from the crystal plates 12 and 13 produce the second ray $e_1O_2O_3$ at a position separated by the distances $2D_H$ and $D_V$ in the H and V directions, respectively, with respect to the reference position.

When the extraordinary rays $e_1$ and $e_2$ of the first and second crystal plates 11 and 12 are emitted as an ordinary ray $O_3$ at the third crystal plate 13, the third ray $e_1e_2O_3$ is produced at a position displaced by $D_H$ in the H direction with respect to the position of the second ray $e_1O_2O_3$.

When the extraordinary ray $e_1$ of the first crystal plate 11 and the ordinary ray $O_2$ of the second crystal plate 12 are emitted as the extraordinary ray $e_3$ of the third crystal plate 13, a fourth ray $e_1O_2e_3$ is produced at a position separated by the distance $P_2$ in a direction of $-45°$ with respect to the second ray $e_1O_2O_3$. The fourth ray $e_1O_2e_3$ is thus produced at a position moved by an amount of $4D_H$ in the H direction with respect to the reference position.

When the extraordinary ray $e_1$ of the first crystal plate 11 and extraordinary ray $e_2$ of the second crystal plate 12 are emitted as the extraordinary ray $e_3$ of the crystal plate 13, a fifth ray $e_1e_2e_3$ is produced at a position moved by the distance $P_2$ in a direction of $-45°$ with respect to the position of the third ray $e_1e_2O_3$. The fifth ray $e_1e_2e_3$ is produced at a position displaced by $D_H$ in the H direction with respect to the position of the fourth ray $e_1O_2e_3$.

When the ordinary ray $O_1$ of the first crystal plate 11 and extraordinary ray $e_2$ of the second crystal plate 12 are emitted as the ordinary ray $O_3$ of the third crystal plate 13, a sixth ray $O_1e_2O_3$ is produced at a position moved by $D_H$ from the reference position on the line of the H direction passing through the reference position.

When the ordinary ray $O_1$ of the crystal plate 11 and ordinary ray $O_2$ of the second crystal plate 12 are separated as the extraordinary ray $e_3$ of the third crystal plate 13, a seventh ray $O_1O_2e_3$ is produced at a position separated by the distance $P_2$ in a direction of $-45°$ from the reference position. Thus, the seventh ray $O_1O_2e_3$ is produced at a position moved by $2D_H$ and $D_V$ in the H and V directions, respectively, form the reference position.

When ordinary ray $O_1$ of the first crystal plate and extraordinary ray $e_2$ of the second crystal plate are separated as the extraordinary ray $e_3$ of the third crystal plate 13, an eighth ray $O_1e_2e_3$ is produced at a position separated by the separation distance $P_2$ in a direction of $-45°$ from the position of the sixth ray $O_1e_2O_3$. Thus, the eighth ray $O_1e_2e_3$ is produced at a position displaced by $D_H$ in the H direction from the seventh ray $O_1O_2e_3$.

Figure 11:
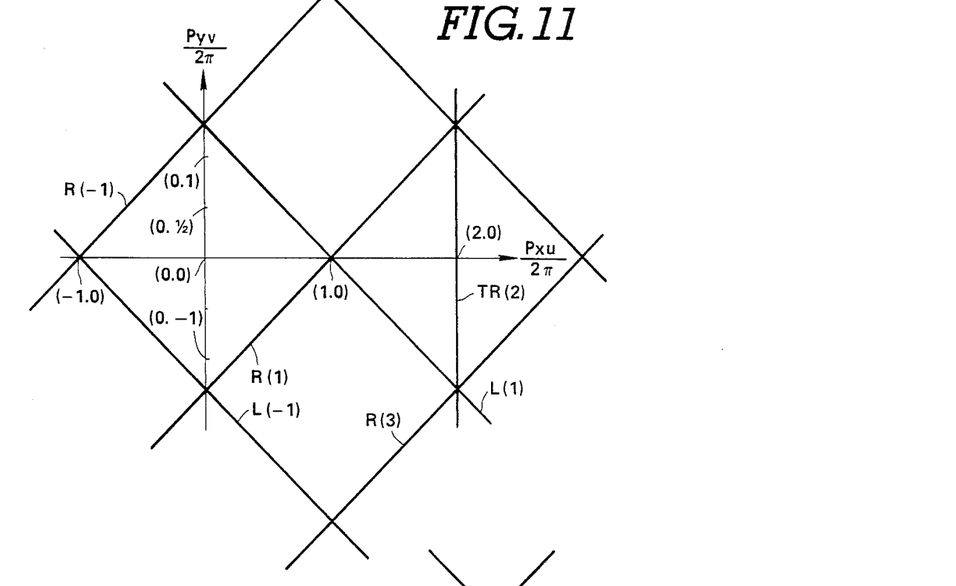
FIGS. 11 and 12 are characteristic graphs illustrating the spatial frequency characteristic of the second preferred embodiment of the present invention.

Thus, when the eight rays are emitted from the third crystal plate 13 each having $\tfrac{1}{8}$ the light quantity of the original incident ray based on the incident light on the reference position from the object to be pictured, the sampled output transmitted form the solid state image-sensing chip exhibits a trap characteristic for the carrier components other than the fundamental or base band component included in the spatial frequency spectrum. The above-described optical low-pass filter products a distribution of the spatial frequency spectrum included in the sampled output as shown in FIG. 11 which corresponds to FIG. 2, producing the trap straight line L($-1$), L(1), L(3), trap straight line R($-1$), R(1), R(3), and trap straight line TR(2) extending in parallel to the V direction.

The trap straight lines L($-1$), L(1), L(3), . . . comprise parallel lines having the mutually identical negative gradients or slopes and passing the frequency positions ($-1$, 0), (1, 0), and (3, 0) and the trap straight lines having the same positive gradients and passing through the freuqency positions ($-1$, 0), (1, 0), (3, 0) . . . in sequence. In this way, the trap straight lines L($-1$), L(1), L(3) and R($-1$), R(1), R(3) are extended to intersect with each other so that a large number of diamond-shaped regions are expanded symmetrically with the frequency position ($f_s=0$, $f_v=0$) as a center.

In addition, the third trap straight line TR(2) passes through the frequency position ($f_s=2$, $f_v=0$) and is extended in parallel to the V axis so as to form a trap straight line which intersects the diamond-shaped regions expanding along the V axis direction at a position higher than the frequency position ($f_s=1$, $f_v=0$).

Figure 12:
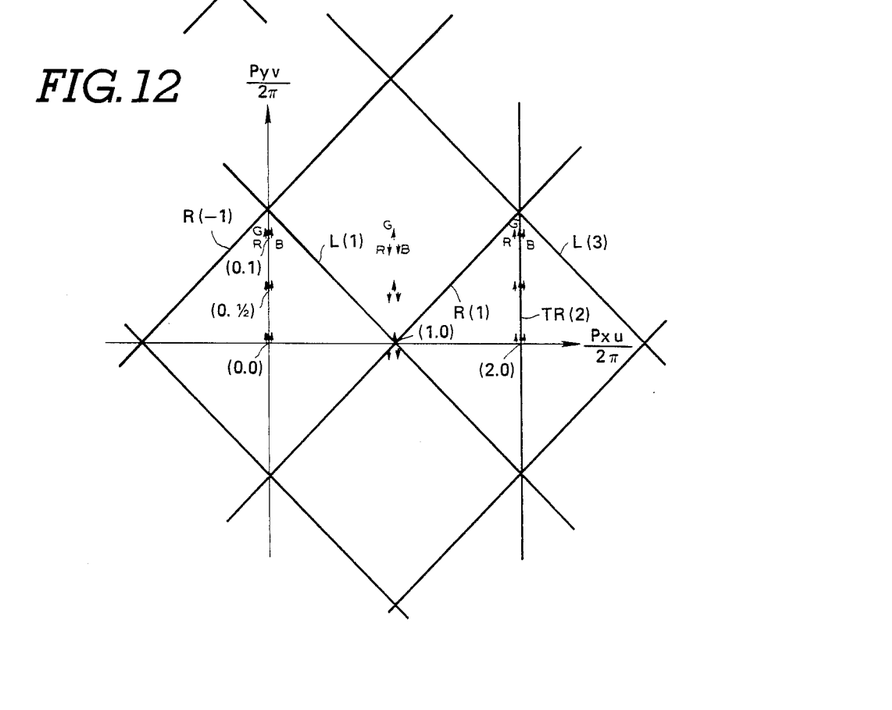

Consequently, the trap effect for unnecessary carrier components included in the sampled outputs can receive a doubled trap effect by means of the trap straight lines L(1) and R(1) at the frequency position ($f_s=1$, $f_v=0$) as shown in FIG. 12 so that the unwanted carrier components can be sufficiently eliminated at the frequency position ($f_s=1$, $f_v=0$).

Since the trap straight lines L(1) and R(−1) intersect at a position adjacent to the frequency position ($f_s=0$, $f_v=1$), the trap effect is doubled so that the unwanted carrier components can be eliminated sufficiently.

By means of this addition, the trap straight line TR(2) is formed parallel to the V axis so that the unnecessary carrier components can effectively be eliminated by means of the unnecessary carrier components produced at the frequency positions ($f_s=2$, $f_v=0$), ($f_s=2$, $f_v=\frac{1}{2}$), and ($f_s=2$, $f_v=1$).

Although the trap straight line TR(2) described above is produced at the position of frequency position ($f_s=2$, $f_v=0$), the frequency position may be at an arbitrary position between $f_s=1$ through 2 expressed as follows:

$$1 \leq TR(2) \leq 2 \qquad (5)$$

The adjustment of the trap straight line TR(2) can be achieved by adjustment of the separation distance $P_1$ of the extraordinary rays of the second crystal plate 12.

It should be understood by those skilled in the art that the foregoing description is directed to preferred embodiments, and that various changes and modifications can be made without departing from the scope of the present invention which is to be defined by the appended claims.

I claim as my invention:

1. An optical low-pass filter for a solid-state color camera, said camera comprising a plurality of solid-state image sensing devices having a predetermined horizontal scanning direction, said solid-state image sensing devices each comprising sensing elements disposed at predetermined repetitive intervals and generating one of a plurality of primary color signals, said filter serving to diffuse an incident light ray to thereby provide a low-pass transmission characteristic for the incident ray, said filter providing the diffused incident ray to said plurality of solid state-image sensing devices, said optical low-pass filter comprising:

(a) a first crystal plate for separating the incident ray into an ordinary ray and an extraordinary ray in a direction of +45° with respect to the horizontal scanning direction of the solid-state image sensing devices, (b) a second crystal plate for separating said incident ray into an ordinary ray and an extraordinary ray in a direction coinciding with said horizontal scanning direction, and (c) a third crystal plate for separating said incident ray into an ordinary ray and an extraordinary ray in a direction of −45° with respect to said horizontal scanning direction, said second crystal plate being located between said first and third crystal plates, the three plates being secured together, whereby the optical low-pass filter diffuses the incident ray into a plurality of rays.

2. An optical low-pass filter according to claim 1 wherein said plurality of solid-state image sensing devices comprises three solid-state image sensing devices each generating a different one of red, green, and blue primary color signals.

* * * * *